(12) United States Patent
Goora et al.

(10) Patent No.: US 9,829,554 B2
(45) Date of Patent: Nov. 28, 2017

(54) MAGNETIC FIELD GRADIENT MONITOR AND MAGNETIC FIELD GRADIENT WAVEFORM CORRECTION APPARATUS AND METHODS

(71) Applicant: University of New Brunswick, Fredericton (CA)

(72) Inventors: Frederic Goora, Fredericton (CA); Bruce Balcom, Fredericton (CA)

(73) Assignee: University of New Brunswick, Fredericton, New Brunswick (CA)

(*) Notice: Subject to any disclaimer, the term of this patent is extended or adjusted under 35 U.S.C. 154(b) by 1069 days.

(21) Appl. No.: 13/866,696

(22) Filed: Apr. 19, 2013

(65) Prior Publication Data
US 2013/0234708 A1    Sep. 12, 2013

Related U.S. Application Data

(63) Continuation-in-part of application No. 13/003,509, filed on Mar. 29, 2011, now Pat. No. 8,717,022.

(51) Int. Cl.
G01V 3/00    (2006.01)
G01R 33/54    (2006.01)
G01R 33/385    (2006.01)
G01R 33/565    (2006.01)
G01R 33/58    (2006.01)

(52) U.S. Cl.
CPC ......... G01R 33/54 (2013.01); G01R 33/3852 (2013.01); G01R 33/56572 (2013.01); G01R 33/58 (2013.01)

(58) Field of Classification Search
CPC .................................................. G01R 33/3852
USPC .................................................. 324/322, 318
See application file for complete search history.

(56) References Cited

U.S. PATENT DOCUMENTS

| | | | |
|---|---|---|---|
| 4,698,591 A | 10/1987 | Glover et al. | |
| 4,950,994 A | 8/1990 | Glover et al. | |
| 6,025,715 A * | 2/2000 | King ............... | G01R 33/385 |
| | | | 324/309 |
| 7,474,100 B2 * | 1/2009 | Schneider ......... | G01R 33/3804 |
| | | | 324/318 |
| 8,717,019 B2 * | 5/2014 | Ookawa ............. | A61B 5/055 |
| | | | 324/307 |
| 8,717,022 B2 * | 5/2014 | Han .................. | G01R 33/243 |
| | | | 324/309 |

OTHER PUBLICATIONS

N. Addy et al., "Simple Method for MR Gradient System Characterization and k-Space Trajectory Estimation," Magn. Reson. Med. 68: 120-129 (2012).

(Continued)

*Primary Examiner* — Louis Arana
(74) *Attorney, Agent, or Firm* — Eugene F. Derényi

(57) ABSTRACT

Method for correcting the magnetic field gradient waveform in a magnetic resonance measurement including extracting an impulse response from the measured step response of a magnetic resonance system, determining the slew rate of the system during the step response measurement, modifying the desired output waveform such that the desired output waveform is constrained to within the slew rate and the bandwidth of the system, and determining the required pre-equalized input waveform.

6 Claims, 14 Drawing Sheets

(56) References Cited

OTHER PUBLICATIONS

M. Morich et al., "Exact Temporal Eddy Current Compensation in Magnetic Resonance Imaging Systems," IEEE Trans. Med. Imaging. 7: 247-254 (1988).

J. Van Vaals and A. Bergman, "Optimization of Eddy-Current Compensation," J. Magn. Reson. 90: 52-70 (1990).

P. Majors et al., "Eddy Current Compensation by Direct Field Detection and Digital Gradient Modification," J. Magn. Reson. 87: 548-553 (1990).

H. Gach et al., "A Programmable Pre-emphasis System," Magn. Reson. Med. 40: 427-31(1998).

V. Schmithorst and B. Dardzinski, "Automatic Gradient Preemphasis Adjustment: A 15-minute Journey to Improved Diffusion Weighted Echo-planar Imaging," Magn. Reson. Med. 47: 208-212 (2002).

K. Bartusek et al., "Determination of Pre-emphasis Constants for Eddy Current Reduction," Meas. Sci. Technol. 21: 1-9 (2010).

W. Spees et al., "Quantification and Compensation of Eddy-current-induced Magnetic-field Gradients," J. Magn. Reson. 212: 116-123 (2011).

S. Vannesjo et al., "Gradient System Characterization by Impulse Response Measurements with a Dynamic Field Camera," Magn. Reson. Med. 69: 583-593 (2013).

M. Bernstein et al., "Handbook of MRI Pulse Sequences," N.p.: Elsevier Inc. (2004), pp. 316-320.

F. Schmitt et al., "Echo-Planar Imaging: Theory, Technique, and Application," N.p.: Springer-Verlag (1998).

W. Block et al., "Consistent Fat Suppression with Compensated Spectral-Spatial Pulses," Magn. Reson. Med. 38(2): 198-206, Aug. 1997.

J. Haselgrove et al., "Correction for Distortion of Echo-Planar Images Used to Calculate the Apparent Diffusion Coefficient," Magn. Reson. Med. 36(6): 960-964, Dec. 1996.

A. Lingamneni et al., "Validation of Cine Phase-Contrast MR Imaging for Motion Analysis," J. Magn. Reson. Imaging 5(3): 331-338, Jun. 1995.

G. Mason et la., "A Method to Measure Arbitrary k-Space Trajectories for Rapid MR Imaging," Magn. Reson. Med. 38 (3): 492-496, Sep. 1997.

Y. Zhang et al., "A Novel k-Space Trajectory Measurement Technique," Magn. Reson. Med. 39(6): 999-1004, Jun. 1998.

J. Duyn et al., "Simple Correction Method for k-Space Trajectory Deviations in MRI," J. Magn. Reson. 132(1): 150-153, May 1998.

DH. Kim and D. Spielman, "Reducing Gradient Imperfections for Spiral Magnetic Resonance Spectroscopic Imaging," Magn. Reson. Med. 56(1): 198-203, Jul. 2006.

P. Latta et al., "Simple Phase Method for Measurement of Magnetic Field Gradient Waveforms," Magn. Reson. Imaging 25(9): 1272-1276, Nov. 2007.

V. Jellus et al., "An NMR Technique for Measurement of Magnetic Field Gradient Waveforms," J. Magn. Reson. 162 (1): 189-197, May 2003.

A. Takahashi and T. Peters, "Compensation of Multi-Dimensional Selective Excitation Pulses Using Measured k-Space Trajectories," Magn. Reson. Med. 34(3): 446-456, Sep. 1995.

M. Alley et al., "Gradient Characterization Using a Fourier-Transform Technique," Magn. Reson. Med. 39(4): 581-587, Apr. 1998.

N. Papadakis et al., "A General Method for Measurement of the Time Integral of Variant Magnetic Field Gradients: Application to 2D Spiral Imaging," Magn. Reson. Imaging 15(5): 567-578 (1997).

N. De Zanche et al., "NMR Probes for Measuring Magnetic Fields and Field Dynamics in MR Systems," 60(1): 176-186, Jul. 2008.

C. Barmet et al., "Spatiotemporal Magnetic Field Monitoring for MR," Magn. Reson. Med. 60(1): 187-197, Jul. 2008.

D. Goodyear et al., "Single Point Measurement of Magnetic Field Gradient Waveform," 163(1): 1-7, Jul. 2003.

D. Hoult and R. Richards,"The Signal-to-Noise Ratio of the Nuclear Magnetic Resonance Experiment," J. Magn. Reson. 24(1): 71-85, Oct. 1976.

D. Hoult, "The Principle of Reciprocity in Signal Strength Calculations: A Mathematical Guide," Conc. Magn. Reson. 12(4): 173-187 (2000).

J. Mispelter et al., "NMR Probeheads for Biophysical and Biomedical Experiments," Imperial College Press (2006).

T. Peck et al., "Design and Analysis of Microcoils for NMR Microscopy," J. Magn. Reson. B 108(2): 114-124, Aug. 1995.

M. Halse et al., "Centric Scan SPRITE Magnetic Resonance Imaging," J. Magn. Reson. 165(2): 219-229, Dec. 2003.

P. Jezzard et al., "Characterization of and Correction for Eddy Current Artifacts in Echo Planar Diffusion Imaging," Magn. Reson. Med. 39(5): 801-812, Dec. 2005.

T. Reese et al., "Reduction of Eddy-Current-Induced Distortion in Diffusion MRI Using a Twice-Refocused Spin Echo," Magn. Reson. Med. 49(1): 177-182, Jan. 2003.

R. Bracewell, "The Fourier Transform and Its Application" (2nd Ed.), McGraw-Hill (1965).

S. Haykin, "Communication Systems," (3rd Ed.), John Wiley & Sons (1978).

H. Liu and G. Xu, "Multiuser Blind Channel Estimation and Spatial Channel Pre-Equalization," IEEE ICASSP (1995), vol. 5, pp. 1756-1759.

T. Keller and L. Hanzo, "Adaptive Modulation Techniques for Duplex OFDM Transmission," IEEE Trans. Vehic. Technol. 49(5): 1893-1906, Sep. 2000.

R. Fischer et al., "MIMO Precoding for Decentralized Receivers," Proc. International Symposium on Information Theory (2002).

M. Joham et al., "Linear Transmit Processing in MIMO Communications Systems," IEEE Trans. Signal Processing 53 (8): 2700-2713, Aug. 2005.

R. Smith and R. Dorf, "Circuits, Devices, and Systems," (5th Ed.), John Wiley & Sons, Toronto (1992).

P. Mansfield, "Multi-planar Image Formation using NMR Spin Echoes," J. Phys. C 10(3): L55-L58 (1997).

H. Han et al., "Direct Measurment of Magnetic Field Gradient Waveforms," Conc. Magn. Reson. A 36A(6): 349-360, Nov. 2010.

H. Han et al., "Pure Phase Encode Magnetic Field Gradient Monitor," J. Magn. Reson. 201(2): 212-217, Dec. 2009.

W. Price, "NMR Studies of Translational Motion," Cambridge University Press, Cambridge (2009).

R. Hurd, "Gradient-Enhanced Spectroscopy," J. Magn. Reson. 213(2): 474-476, Dec. 2011.

R. Hurd and B. John, "Gradient-Enhanced Proton-Detected Heteronuclear Multiple Quantum Coherence Spectroscopy," J. Magn. Reson. 91: 648-653 (1991).

L. Kay et al., "Pure Absorption Gradient Enhanced Heteronuclear Single Quantum Correlation Spectroscopy with Improved Sensitivity," J. Am. Chem. Soc. 114: 10663-10665 (1992).

M. Sattler et al., "Heteronuclear Multidimensional NMR Experiments for the Structure Determination of Proteins in Solution Employing Pulsed Field Gradients," Prog. Nucl. Magn. Reson. Spectrosc. 34: 93-158 (1999).

R. Turner and R. Bowley, "Passive Screening of Switched Magnetic Field Gradients," J. Phys. E: Sci. Instrum. 19: 876-879 (1986).

P. Mansfield and B. Chapman, "Active Magnetic Screening of Gradient Coils in NMR Imaging," J. Magn. Reson. 66: 573-576 (1986).

P. Mansfield and B. Chapman, "Active Magnetic Screening of Coils for Static and Timedependent Magnetic Field in NMR Imaging," J. Phys. E: Sci. Instrum. 19: 540-545 (1986).

P. Mansfield and B. Chapman, "Multishield Active Magnetic Screening of Coil Structures in NMR," J. Magn. Reson. 72: 211-223 (1987).

B. Chapman and P. Mansfield, "Quiet Gradient Coils: Active Acoustically and Magnetically Screened Distributed Transverse Gradient Designs," Meas. Sci. Technol. 5: 349-354 (1995).

R. Bowtell and P. Mansfield, "Gradient Coil Design using Active Magnetic Screening," Magn. Reson. Med. 17: 15-21 (1991).

S. Hidalgo-Tobon, "Theory of Gradient Coil Design Methods for Magnetic Resonance Imaging," Concepts Magn. Reson., Part A. 36: 223-242 (2010).

A. Kerr, "Real-time Interactive MRI on a Conventional Scanner," Magn. Reson. Med. 38: 355-367 (1997).

(56) References Cited

OTHER PUBLICATIONS

P.J. Beatty et al., "Rapid Gridding Reconstruction with a Minimal Oversampling Ratio," IEEE Trans. Med. Imaging. 24: 799-808 (2005).
H. Tan and C. Meyer, "Estimation of k-Space Trajectories in Spiral MRI," Magn. Reson. Med. 61: 1396-404 (2009).
H. Han et al., "Non-Cartesian Sampled Centric Scan SPRITE Imaging with Magnetic Field Gradient and B0(t) Field Measurements for MRI in the Vicinity of Metal Structures," J. Magn. Reson. 206: 97-104 (2010).

* cited by examiner a)

b)

MAGNETIC FIELD GRADIENT MONITOR AND MAGNETIC FIELD GRADIENT WAVEFORM CORRECTION APPARATUS AND METHODS

CROSS-REFERENCE TO RELATED APPLICATIONS

This application is a Continuation-in-Part of U.S. application Ser. No. 13/003,509 filed Mar. 29, 2011.

FIELD OF THE INVENTION

The present invention relates to magnetic resonance imaging ("MRI") generally, and pure phase encode magnetic field gradient monitoring and magnetic field gradient waveform correction in particular.

BACKGROUND OF THE INVENTION

Magnetic field gradients play a central role in magnetic resonance ("MR") imaging. Their functions include encoding spatial information and sensitizing the image contrast to coherent or incoherent motion. Fast, efficient MRI measurements rely on magnetic field gradient waveforms with high temporal fidelity.

Rapid switching of the magnetic field gradients leads to rapidly changing magnetic flux through the radio frequency ("RF") coil, RF shield, main magnet components and other structures. This changing magnetic flux leads to eddy currents being induced in conducting pathways near the magnet bore. Hardware improvements such as shielded gradient coils and waveform pre-emphasis are largely successful at reducing these effects in modern scanners. The residual eddy currents may however still cause image-quality problems [1] including ghosting in echo planar imaging ("EPI"), rapid acquisition with refocused echo ("RARE") and gradient and spin echo ("GRASE") imaging pulse sequences [2], slice-profile modulation with spatial-spectral RF pulses [3], geometric distortion in diffusion-weighted EPI [4], and quantitative velocity errors in phase-contrast imaging [5]. Knowledge of the true gradient waveform in the MRI pulse sequence is critical to addressing and remedying such problems.

Numerous methods have been developed to measure MRI gradient waveforms and k-space trajectories [6-14]. One strategy is magnetic field monitoring with RF microprobes ("MFM") [15-16]. Multiple RF microprobes record the magnetic field evolution associated with a wide variety of imaging pulse sequences.

The MFM method involves exciting the sample and measuring the time evolution of magnetization through the free induction decay ("FID"). However, the gradient waveform duration is limited by the sample $T_2^*$. The k-space maxima (i.e. maximum temporal gradient area or image resolution) measurable with MFM are also limited by gradient dephasing. In addition, implementation of this technique is relatively complex as it requires careful probe fabrication, an array of at least 3 probes, accurate probe positioning and alignment and a multi channel receiver.

Due to the ubiquitous nature of eddy currents, there is a need for a method to characterize and minimize their impact on image quality.

SUMMARY OF THE INVENTION

One aspect of this invention is a pure phase encode version of the MFM measurement for mapping magnetic field gradient waveforms. This method involves a heavily doped small water droplet (diameter ≤1~3 mm) within a micro RF coil excited by a series of closely spaced broadband RF pulses each followed by single FID point acquisition.

Compared with the prior art frequency encode magnetic field monitoring with nuclear magnetic resonance ("NMR") microprobes, pure phase encode detection with RF microprobes has distinct advantages: (i) there is no $T_2^*$ decay limitation on the waveform measurement and thus measurements of long duration gradient waveforms are possible; (ii) gradient dephasing is avoided by decomposing the large gradient area into small separate gradient areas with short time interval $t_p$ and thus there is no limit on the k-space maxima or net gradient area maxima; (iii) it allows measurement of high amplitude gradients for imaging and diffusion; and (iv) simple probe construction is possible since susceptibility matching probe components are not required.

One aspect of this invention is a method of measuring a magnetic field gradient within a local area of a magnetic field gradient in an NMR sample space comprising the steps of providing a reference sample in the local area, providing a probe suitable for holding the reference sample, exciting the reference sample by a broadband RF pulse, acquiring a free induction decay (FID) signal from the reference sample, and recording the magnetic field gradient amplitude in the FID after a fixed phase encode interval after the RF pulse. The RF pulse can also be a series of pulses and a single FID point or cluster of individual FID points may be acquired after each RF pulse, as the underlying magnetic field gradient changes in time. The reference sample may comprise water doped with an MR contrast agent such as gadolinium chloride ($GdCl_3$). The probe may be a single turn solenoid or multiple turn solenoid.

In another aspect, this invention teaches the use of single point pure phase encode gradient waveform measurement for a local measurement in an NMR sample space.

Yet another aspect of this invention is a method of measuring a gradient waveform in an NMR sample space, comprising the steps of providing a reference sample in the sample space, applying a series of RF pulses, providing a gradient pulse, and acquiring a single FID point after a phase encoding time. To measure the full gradient waveform, the method can be repeated. The RF pulses can be low flip angle RF pulses that provide a reference phase prior to the gradient pulse.

In another aspect, this invention discloses a probe for measuring a magnetic field gradient within a local area of a magnetic field gradient in an NMR sample space comprising a probe formed as a solenoid for containing a reference sample.

In another aspect, this invention is a method that utilizes the magnetic field gradient waveform monitor method to directly measure the temporal evolution of the magnetic field gradient from a step-like input function and extracts the system impulse response. With the basic assumption that the gradient system is sufficiently linear and time invariant to permit system theory analysis, the impulse response is used to determine a pre-equalized (optimized) input waveform that provides a desired gradient response at the output of the system. An algorithm calculates a pre-equalized waveform that is physically realizable and accounts for system limitations including system bandwidth, amplifier slew rate capabilities, and noise inherent in the initial measurement.

The impulse-response based method according to an aspect of the invention permits the determination of pre-equalized waveforms for arbitrary gradient output waveforms that are required for any magnetic resonance experiment and are applicable to any magnetic resonance scanner.

In yet another aspect, the present invention relates to a method wherein an NMR system impulse response (transfer function h(t)) is used to determine a pre-equalized waveform and in which a known input x(t) is applied to the gradient amplifier/coil/system h(t) and the temporal evolution of the magnetic field gradient y(t) is measured using a magnetic gradient waveform measurement method. The magnetic gradient waveform measurement method may for example be a magnetic field gradient monitor method ("MFGM") described in parent U.S. application Ser. No. 13/003,509 filed Mar. 29, 2011, and also as described in this disclosure. In general, the MFGM method is a pure-phase encode method that is used to measure the magnetic field gradient waveform y(t) resulting from a known input waveform x(t) with short rise and fall times and a 2-8 ms hold time. Due to system constraints, a long phase encode time $t_p$ may result in the averaging of the measured phase over the acquisition time due to the system deadtime and will cause a loss of temporal resolution. A multiple point approach ("MPA") may be used to decouple the phase encode time from the measurement and permit the measurement of phase over a period defined by the dwell time of the system. In another aspect of this invention, the magnetic gradient waveform measurement method may for example be an MFM method.

In another aspect, this invention relates to a method of providing measured NMR data, and extracting an impulse response from the measured data. In one aspect of this invention, the impulse response may be extracted by differentiating the positive going portion of the input step. This impulse response is then deconvolved from the desired gradient waveform to determine the pre-equalized waveform. The pre-equalized waveform is then used as the gradient current excitation waveform for subsequent measurements. Once the system impulse response is determined for each gradient axis, the pre-equalized waveform from any arbitrary waveform can be determined.

In another aspect of this invention, the pre-equalized waveform may be determined by division of the frequency domain representations of the desired output waveform and the extracted impulse response and transforming this data to the time domain.

In a still further aspect, this invention relates to a method for correcting the magnetic field gradient waveform in a magnetic resonance measurement including extracting an impulse response from the measured step response of a magnetic resonance system, determining the slew rate of the system during the step response measurement, modifying the desired output waveform such that the desired output waveform is constrained to within the slew rate and the bandwidth of the system, and determining the required pre-equalized input waveform. In an aspect of this invention, the required pre-equalized waveform is determined through a deconvolution of the desired output waveform with the extracted impulse response in the time domain. In another aspect of this invention, the required pre-equalized waveform is determined through division of the frequency domain representations of the desired output waveform and the extracted impulse response and transforming this data to the time domain. In a still further aspect of this invention, the pre-equalized waveform may be applied to the input of the gradient system resulting in an output waveform that corresponds to the desired constrained waveform.

DETAILED DESCRIPTION OF THE PREFERRED EMBODIMENTS

Two trial gradient waveforms illustrate the advantages of the method of this invention. Neither could be measured by conventional MFM. One illustrates the ability to measure extended duration magnetic field gradient waveforms while the other illustrates the ability to measure magnetic field gradient waveforms with large net gradient area and/or high amplitude (a simple bipolar diffusion gradient waveform, $G_{max}$=250 mT/m, b value approx=100,000 s/mm²).

The RF micro coil utilized is extremely easy to fabricate, compared with MFM RF microprobes [15-16]. Susceptibility matching for improved static field homogeneity is not an issue. One small probe is sufficient to measure all three gradient axes and a multi channel receiver is not a prerequisite. The method is a point monitor where the probe location does not need to be exactly known.

The RF micro coil utilized provides a high measurement sensitivity compared to prior art [17] due to the maximized probe filling factor and a stronger $B_1$ field per unit current [18-19]. Prior art studies have employed a thin uniform cylindrical gel sample. It is however hard to make a thin slice phantom (thickness <3 mm) and position it orthogonal to 3 gradient directions sequentially. The method of this invention does not require phantom movement for 3 dimensional gradient measurements. The method of this invention is a point monitor with simple implementation, low cost hardware requirement but sensitive calibration.

Small NMR Probe for Gradient Monitor

For magnetic field gradient measurements, transverse magnetization dephasing due to the gradient is always an issue. Smaller samples are usually required to limit signal decay due to gradient dephasing. This naturally suggests a correspondingly small RF probe. The method of this invention acquires a single FID point after a short phase encoding time $t_p$ following each RF excitation. In another embodiment, a few FID points can be acquired. Therefore it has a significant advantage against gradient dephasing compared with conventional MFM. Although a true microcoil will work efficiently with this strategy, a small NMR coil (phantom size from mm to a few cm) with simple fabrication is generally suitable.

Pure Phase Encode

Figure 2:
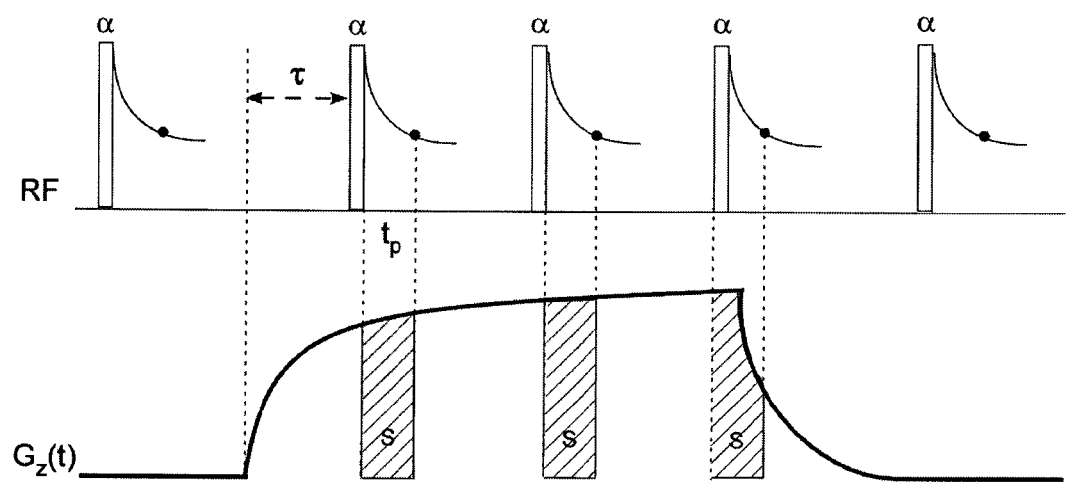
FIG. 2 is a schematic diagram showing a pulse sequence.

The waveform measurement pulse sequence is illustrated in FIG. 2. A series of broadband RF pulses are employed in each execution of the pulse sequence to create transverse magnetization in the presence of the gradient. RF pulses prior to the gradient pulse provide a reference phase. A sample with very short $T_1$, $T_2$ ensures each RF excitation is independent of all other excitations i.e. the sample magnetization will be at equilibrium for each pulse. Following each RF excitation after a fixed duration phase encoding time $t_p$, a single FID point is acquired. Gradient area S can be used to determine the phase for each measurement. With each repetition of this basic measurement sequence, following necessary signal averaging, the time variable G is incremented. The gradient waveform can thus be measured with high temporal resolution. Multi FID point detection will also improve the temporal resolution.

With a spherical sample positioned parallel to the axis of magnetic field gradient $G_z$ with an offset $z_0$ relative to the gradient origin, the single point phase is $$\theta = \gamma G_z t_p z_0. \quad (1)$$

The signal phase is thus a direct measurement of average gradient amplitude $G_z$ during the chosen measurement interval $t_p$.

The analytical 1D Fourier transformation of a sphere gives the magnitude of the single point:

$$|S_{(k)}| = 2\pi a^3 \operatorname{Sinc}(2\pi k a) + \left(\frac{1}{2\pi^2 k^3} - \frac{a^2}{k}\right)\operatorname{Sin}(2\pi k a) - \frac{a}{\pi k^2}\operatorname{Cos}(2\pi k a), \quad (2)$$

where k is $\gamma/2\pi G_z t_p$ and a is the radius of sphere. Eq. (2) is a Sin c like function with the first zero crossing at k=0.72/a.

For conventional MFM based on frequency encoding, the highest k is limited by Eq. (2). For a sphere, k must be smaller than 0.72/a to avoid gradient dephasing. Spatial resolution in a common 2D Cartesian k-space image is thus limited to a/1.01 [16]. High k-space values correspond to large net gradient areas by definition, $$k = \frac{\gamma}{2\pi} \int_0^t G(t')dt'.$$

For the new method with pure phase encoding, the gradient waveform is measured by decomposing the large gradient area into small separate gradient areas with a short duration $t_p$. Thus for the same sample geometry, the new method can readily measure two orders of magnitude higher k-space compared to conventional MFM. For the same reason the new method can measure gradient amplitudes more than two orders of magnitude greater than for MFM.

Small NMR Probe and Nature of the Sample

Conventional MFM [15-16] involves exciting the test sample and measuring the time evolution of magnetization through the FID. The duration of the gradient waveform is thus limited by sample $T_2^*$ (i.e. static field inhomogeneity). The limit can be alleviated by fabricating a complex probe with susceptibility matched materials.

The pure phase encode method of this invention measures the gradient waveform through measuring discrete gradient areas. Preferably, a sample with a short $T_2$ (100 µs) is chosen. The sample $T_2^*$ is dominated by the short $T_2$ and thus the probe fabrication is simple and does not require susceptibility matching.

For the pure phase encode gradient monitor, the probe does not have to be micro scale. A larger NMR coil (phantom size from mm up to a few cm) with simple fabrication is adequate for measuring a wide range of gradient amplitudes.

Figure 1:
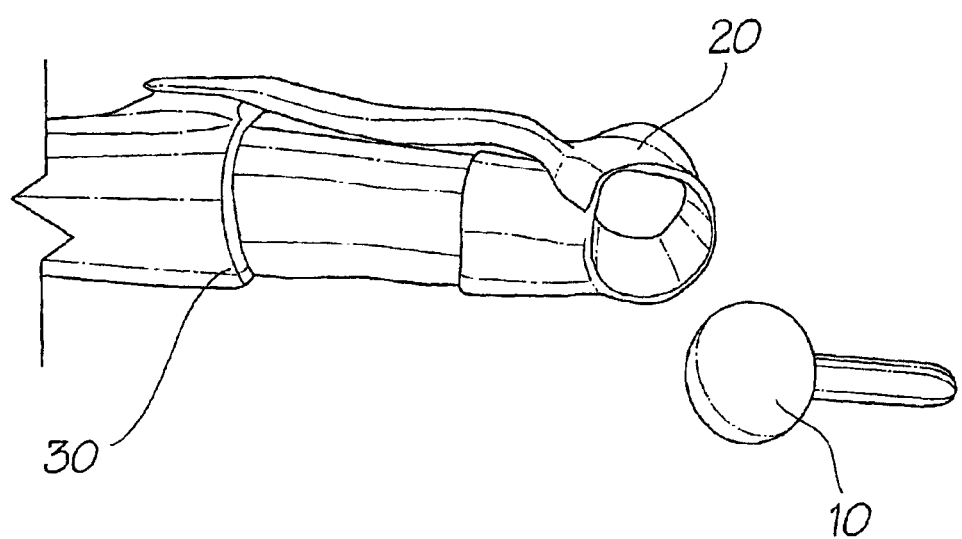
FIG. 1 is a photograph of a single turn solenoid coil probe.

In one embodiment shown in FIG. 1, a single turn solenoidal coil is used [20]. The probe can be any vessel suitable for holding a reference (phantom) sample for NMR measurement such as doped water that yields an experimental signal. The RF probehead 20 shown is a single turn solenoid, with a cylindrical copper conductor, that is electrically connected to a coaxial cable 30. The embodiment shown in FIG. 1 includes a bulb 10 for containing doped water. A heavily $GdCl_3$ doped water drop ($T_2^*$, $T_2$, $T_1$s=60~100 µs) was syringed into the bulb 10 and flame sealed. It will be understood by those skilled in the art that the doping agent can be any number of paramagnetic metals which function as strong MR contrast agents. The probe was tuned to 100 MHz and capacitively matched with a Q value of 100. The probe was enclosed in an RF shield for measurement. Preferably, the probe is constructed from teflon and copper and has negligible background signal.

Another probe that can be used is described [15] but it should be understood that magnetic susceptibility matched components need not be used in the probes of the present invention.

It will be understood by those skilled in the art that the probes and methods of the present invention are used with conventional NMR apparatus such as described in this application in the examples.

The methods of the present invention enable measurement of the true magnetic field gradient waveform of the sample space (including any eddy currents or other distortions present). NMR measurements on the sample can then be corrected using suitable hardware or software to yield improved results.

The larger size sample permits the SNR of the RF receiver coil to be increased significantly since the overall signal is directly proportional to the sample volume [18, 21]. A short sample $T_1$ (100 µs) allows the monitoring probe to continuously pulse during the imaging pulse sequence.

The small size of the test sample and associated RF probe permits the gradient waveform and non-ideal behavior to be spatially resolved inside the MRI sample space, inside the MRI RF probe by simple translation of the point sensor. There is an additional benefit associated with the small RF probe point sensor approach. The gradient waveform measurement should be undertaken in the presence of the MRI RF probe since in many instances the MRI RF probe will support eddy currents. Prior art method [17] employed the MRI RF probe for the waveform measurement but this method is vulnerable to background short $T_2^*$ signals from the probe body. The pure phase approach with a dedicated small RF probe avoids the background signal problem since it is relatively easy to eliminate all short $T_2^*$ signal components from the home built probe.

The Conical SPRITE Gradient Waveform Measurement

Conical SPRITE [22] is a 3D, pure phase encode, Single Point Ramped Imaging with $T_1$-Enhancement (SPRITE) MRI method for studies of short relaxation time systems. Conical SPRITE samples k-space with a system of modified Archimedean spiral trajectories mapped to conical surfaces.

Figure 3:
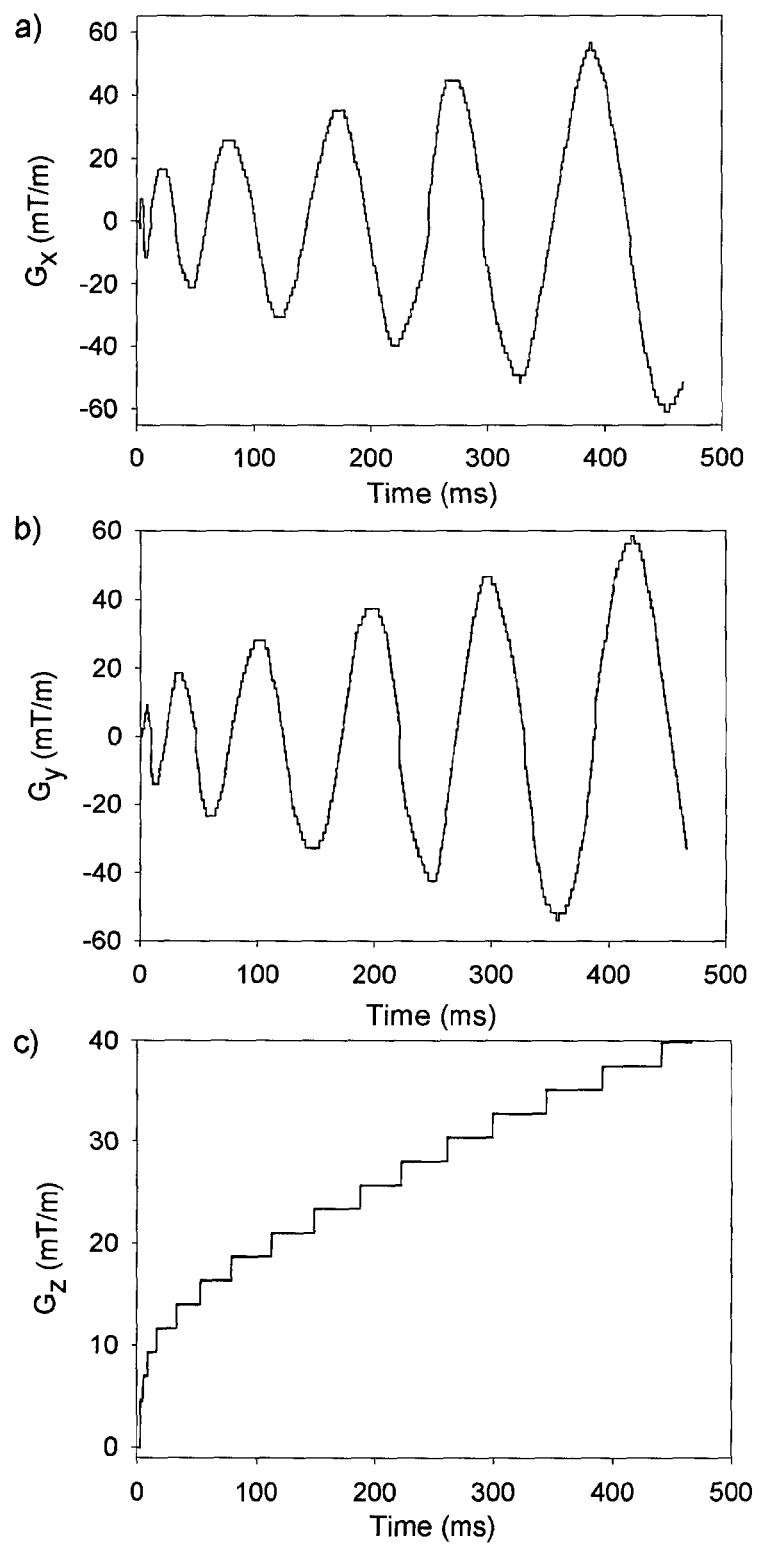
FIGS. 3(a), 3(b) and 3(c) are graphs showing measured magnetic field gradient waveforms associated with a single conical SPRITE trajectory.
Figure 4:
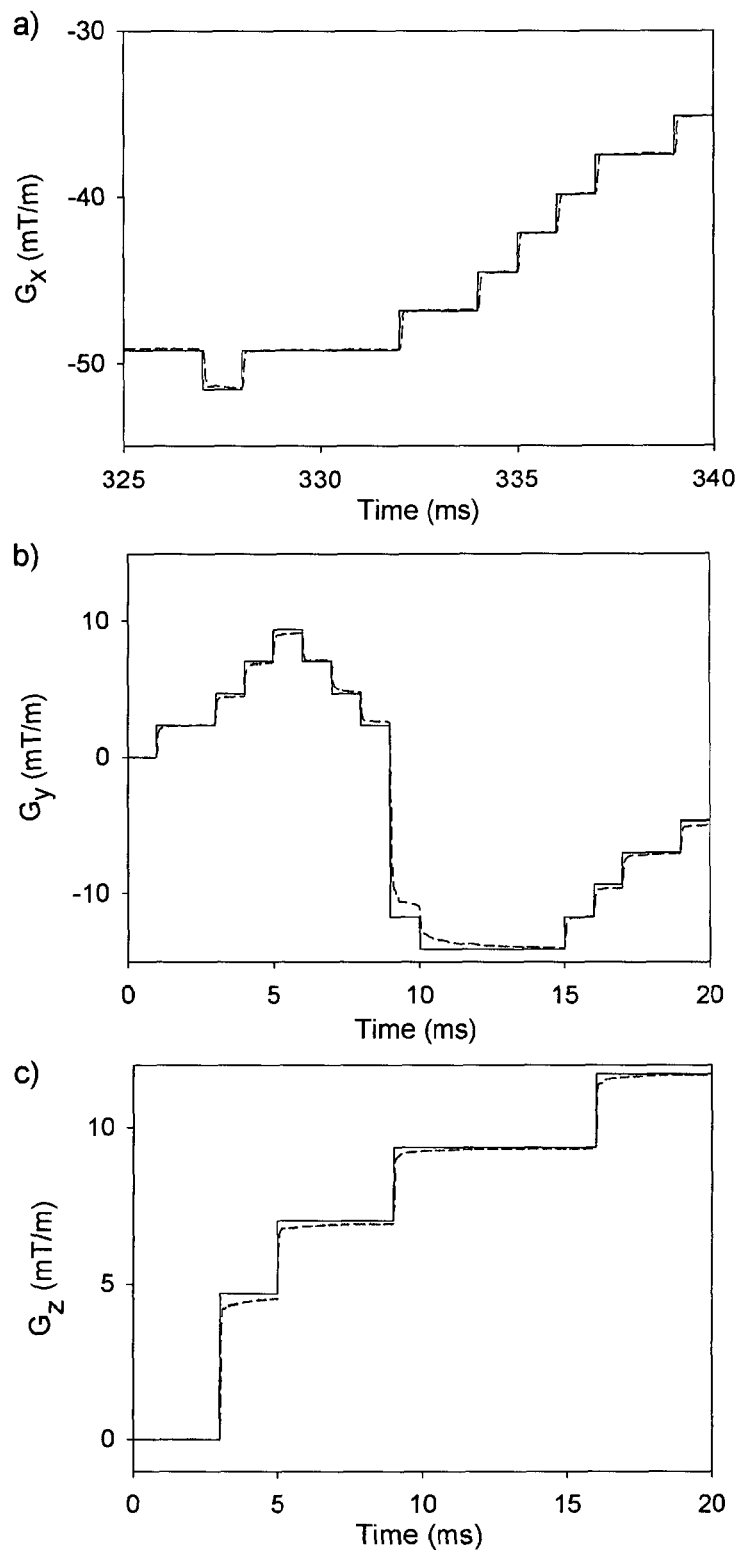
FIGS. 4(a), 4(b) and 4(c) are graphs showing expanded portions of the gradient waveforms of FIG. 3.

FIGS. 3 and 4 show the 3D gradient waveforms of a single interleave conical SPRITE k-space trajectory. The x and y gradients vary sinusoidally, while the z gradient is a stepped linear ramp. The trajectory in conical SPRITE is different from that used in frequency encoding MRI. The gradient amplitudes of each step are calculated to ensure the acquired k-space data points fall on cartesian grid points.

The gradient waveform duration in conical SPRITE varies from hundreds of milliseconds up to seconds. With conventional MFM [15-16], the transverse magnetization will completely dephase after a long duration due to the $T_2^*$ decay. The phase will become uncertain due to a low SNR, thus a long duration gradient waveform is not measurable. However for the pure phase encode measurement the duration of the gradient waveform can be infinitely long.

Three axis gradient waveforms, FIGS. 3 and 4, were measured with the probehead positioned at approximate x, y, z offsets of 20 mm, 18 mm, 30 mm from the gradient isocenter. FIG. 3 shows the measured waveforms plotted simultaneously with the input waveforms. The x and y gradients vary sinusoidally, while the z gradient is a stepped linear ramp. The y direction gradient has a slower rise time compared with the x direction gradient. There are appreciable mismatches of some gradient steps between the measured and the ideal y direction waveforms which will cause k-space misregistration in image reconstruction. The trajectory in conical SPRITE is different from that used in frequency encoding MRI. Note in particular the discrete nature of the waveform. The ideal input waveforms (-) and measured output waveforms ( - - - ) for $G_x$, $G_y$, and $G_z$ are essentially overlapped in these figures. The time resolution of the measurement is 10 µs with 47,600 experimental data points displayed.

In FIG. 4(a), gradient $G_x$ matches the ideal waveform quite well in the time window 325-340 ms. In FIG. 4(b), gradient $G_y$ is significantly in error in the time window 0-20 ms. In FIG. 4(c), the $G_y$ gradient deviates from the ideal in the vicinity of large gradient changes in the time window 0-20 ms. The waveform temporal resolution was 10 µs per point with 15,000 data points displayed for x, and 20,000 data points for y and z respectively.

Diffusion Gradient Waveform Measurement

For most diffusion imaging sequences (e.g., diffusion weighted EPI), the diffusion sensitization b value is on the order of 1000 s/mm². The diffusion sensitizing gradients employed are usually the maximal gradient strength which can be provided by the MRI scanner. However large gradient switching will induce eddy currents even in MRI systems with good eddy current compensation. The eddy currents may cause various artifacts (e.g., geometric distortion) in diffusion weighted images [23-24].

It is preferable to measure the diffusion gradient waveforms associated with the diffusion-weighted imaging sequence for post acquisition image processing or pre-adjusting the gradient waveform to eliminate the eddy current effects. For conventional MFM [15-16], the net gradient area (i.e. the k value) that can be measured is limited by gradient dephasing. For example, a sphere sample with diameter 1 mm has the maximum k value limited to 1.44 mm$^{-1}$ and the net gradient area is limited to 34 ms mT/m. However the net gradient area in a diffusion waveform is usually on the order of 1000 ms mT/m. Net gradient area larger than 1000 ms·mT/m occurs frequently in restricted diffusion MRI measurements. In a small FOV imaging sequence (e.g., small animal imaging) a large k-space excursion is required to achieve high spatial resolution.

Figure 5:
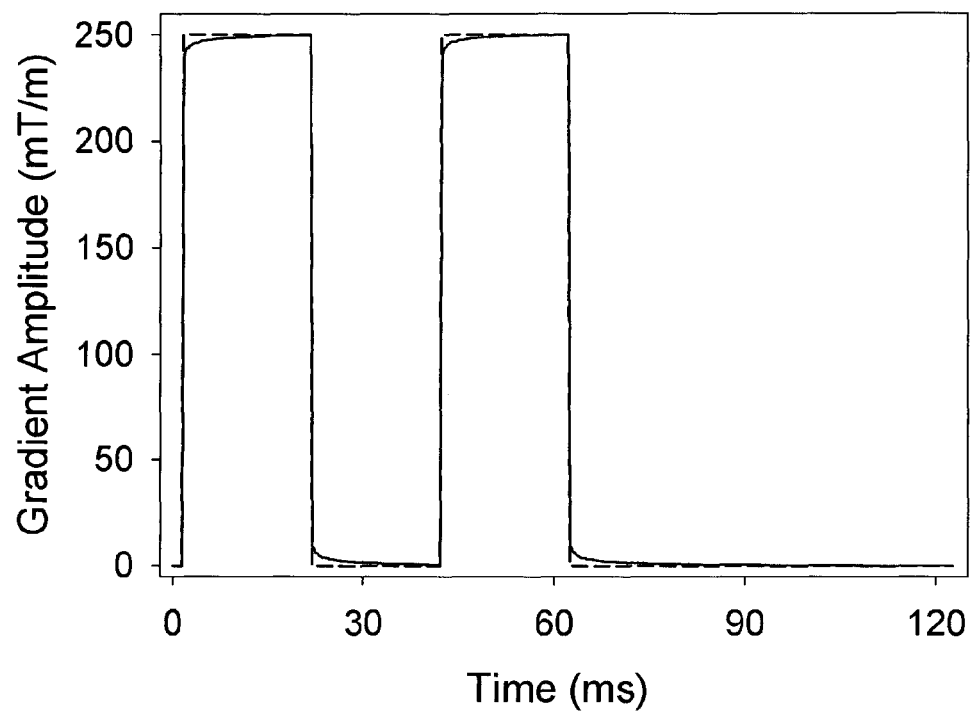
FIG. 5(a) is a graph showing bipolar diffusion gradient waveform measurement with a maximum gradient b value of approximately 100,000 s/mm² for a $G_{max}$ of 250 mT/m.
FIG. 5(b) is a graph showing an expanded portion of the gradient waveform of FIG. 5(a) in the time window 0-60 ms.
Figure 5:
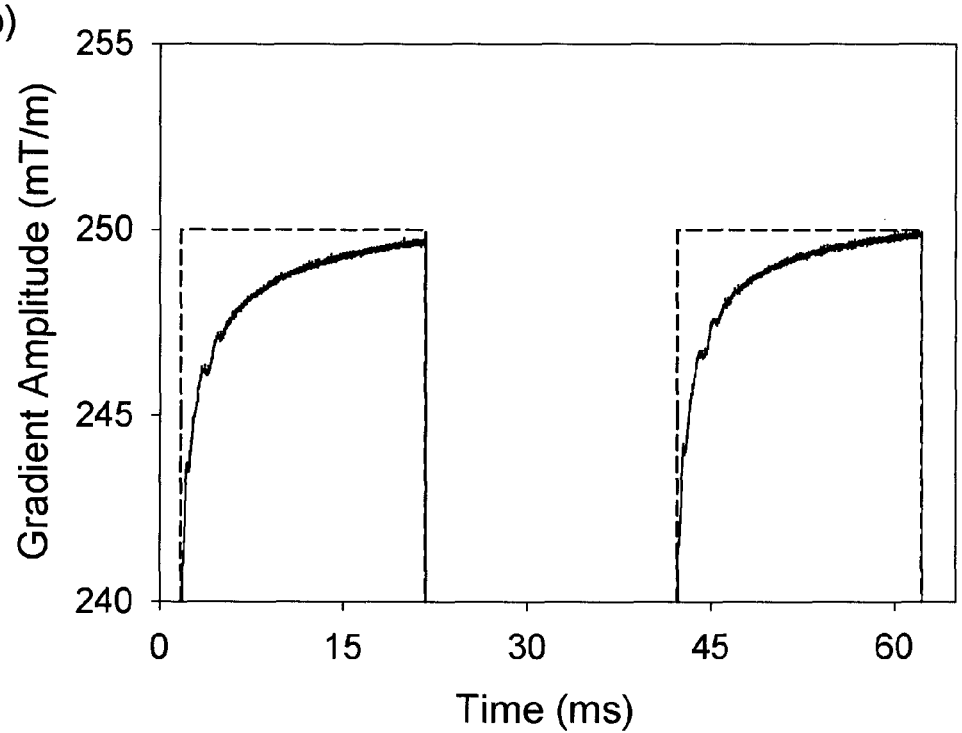

As shown in FIG. 5, the pure phase encode method disclosed in this invention can readily measure the gradient waveforms associated with these applications. In FIG. 5(a), a bipolar diffusion gradient waveform (b value approximately=100,000 s/mm², $G_{max}$=250 mT/m) was measured. Two trapezoidal gradient lobes with a width of 20.25 ms were separated by 40.5 ms. The trapezoidal gradient ramp time was 250 µs. The gradient ramp time is insignificant compared to the natural rise time of the gradient and the trapezoidal gradient shape is not apparent in FIG. 5. The maximal gradient area is as large as 10,000 ms·mT/m. There was a significant difference between the ideal waveform (-) and the measured gradient waveforms ( - - - ). Note the discrepancies during the stabilization stage and during gradient turnoff.

FIG. 5(b) shows an expanded portion of the gradient waveform of FIG. 5(a) in the time window 0-60 ms. This graph shows that the amplitude of second lobe is slightly larger than that of the first lobe. As anticipated, the eddy current induced by the first gradient pulse contributes to the second gradient lobe. Note the measured and ideal waveforms are essentially overlapped during gradient turnoff in FIG. 5(b). The experimental waveform resolution is 10 µs per point.

Assume for a real diffusion measurement, it was calculated that the net area of the diffusion-weighting gradient waveform after a refocusing RF pulse is 0.2% bigger than the net area before the refocusing pulse. This is equivalent to a spoil gradient with area of 10 ms mT/m applied after the refocusing pulse and will cause a signal attenuation larger than ideal. This would be sufficient to yield an incorrect diffusion measurement.

Since the entire diffusion sensitizing gradient waveform associated with an imaging pulse sequence is measured by this method, different strategies might be envisioned to compensate for the non-ideal gradient behavior/eddy current effect. One strategy is to adjust the gradient waveform, guided by the waveform measurement, to better approximate ideal behavior.

$B_0(t)$ Eddy Current Measurement with MFGM

If $B_e(r, t)$ is the z component of the eddy-current magnetic field that results from pulsing the gradient coils, then a Taylor expansion gives:

$$B_e(r,t)=b_0(t)+r\cdot g(r) \quad (3)$$

The first term is usually called the $B_0$ eddy current. The second term is called the linear eddy current.

In one embodiment of this invention, one MFGM probe is placed at two different locations or an array of two MFGM probes is used with each at a different location to measure $B_{0eddy}(t)$, the $B_0$ eddy current. For MFGM probe samples positioned at location $z_1$ and $z_2$, an offset to the gradient origin along the axis of magnetic field gradient $G_z$, the single point phase for the two cases is:

$$\theta_1=\gamma G_z(t)z_1 t_p+\gamma B_{0eddy}(t)t_p \quad (4)$$

$$\theta_2=\gamma G_z(t)z_2 t_p+\gamma B_{0eddy}(t)t_p \quad (5)$$

$B_{0eddy}(t)$ and $G_z(t)$ can thus be solved from the two equations.

In another embodiment, an array of two MFGM probes is used with each at a different location to measure $B_{0eddy}(t)$ and $G_z(t)$ simultaneously.

By analogy, placing one MFGM probe at more than two different locations permits the measurement of $B_{0eddy}(t)$, $G_x(t)$ and $G_y(t)$. Using an array of more than two MFGM probes with each at a different location permits the measurement of $B_{0eddy}(t)$, $G_x(t)$ and $G_y(t)$ simultaneously.

In yet another embodiment of this invention, a multiple FID point method is used to measure $B_0(t)$, $G_x(t)$ and $G_y(t)$. This method can be used to largely increase the SNR of experiments through increasing the phase evolution since the phase evolution i.e, $\gamma B_{0eddy}(t) t_p$ caused by $B_0$ eddy current is usually small with a small encoding time $t_p$ and the phase discrimination may not be good. A sample with relatively longer relaxation times ($T_1$, $T_2$, $T_2^*>100$ µs) can be used instead. An entire FID should be acquired following each RF excitation. The two equations for two probes at two different locations are:

$$\theta_1(t)=\gamma G_z(t)z_1 t+\gamma B_{0eddy}(t)t \quad (6)$$

$$\theta_2(t)=\gamma G_z(t)z_2 t+\gamma B_{0eddy}(t)t \quad (7)$$

$\theta_1(t)$ is the FID point phase following each RF excitation. A linear least square fitting algorithm can be used to extract $B_{0eddy}(t)$ and $G_z(t)$. This method is well suited for clinical MR applications where lower amplitude gradients (<4 G/cm) are usually employed. Because the FID decay following each RF excitation will be dominated by the short $T_2^*$, not by gradient dephasing, a number of FID points following each RF excitation with a good SNR thus should be used in gradient measurement. This multiple FID point strategy can increase the SNR as well as decrease the scan time. It decreases the number of MFGM probes with a probe array for simultaneously monitoring the gradient waveform and $B_0(t)$ during actual imaging acquisition.

Experiments

A spherical bulb micro cell of 3 mm inside diameter and 5 mm outside diameter was employed as the phantom (Wilmad Glass, Buena, N.J.). A heavily $GdCl_3$ doped water solution ($T_2^*$, $T_2$, $T_1=60\sim100$ µs) was carefully syringed into the bulb and the bulb flame sealed.

A single turn solenoidal coil was fabricated by soldering a slotted copper tube (6 mm in O.D, 4 mm in length) with a piece of rigid coaxial cable (6.35 mm in O.D, 33 mm in length) with a Teflon dielectric. The probe and sample are usually wrapped in a copper RF shield. The probe was tuned to 100 MHz and capacitively matched to 50Ω. The probe Q value was 100. The RF amplifier output power was 10 Watts for a 90° pulse length of 5 µs with a deadtime of 12 µs. The minimum phase encode time was thus 12.5 µs.

Gradient waveform measurements were undertaken on a Nalorac (Martines, Calif.) 2.4 T 32 cm i.d horizontal bore superconducting magnet. The console was a Tecmag (Houston, Tex.) Apollo. A water cooled 7.5 cm i.d. gradient set was employed for gradient waveform measurements. The gradient set was driven by a Techron (Elkhart, Ind.) 8710 amplifier. The RF probe was driven by a 2 kW AMT (Brea, Calif.) 3445 RF amplifier after 23 db attenuation.

For each waveform gradient measurement, the time interval between consecutive RF pulses was 250 µs. The RF pulse duration was 1 µs for a flip angle of 18°. The experimental waveform time resolution was typically 10 µs/point. The phase encoding time was 40 µs with 64 averages normally collected for a total scan time of 5 minutes for the diffusion waveform measurement and 15 minutes for each direction of the conical SPRITE waveform measurement.

System Impulse Response

Figure 6:
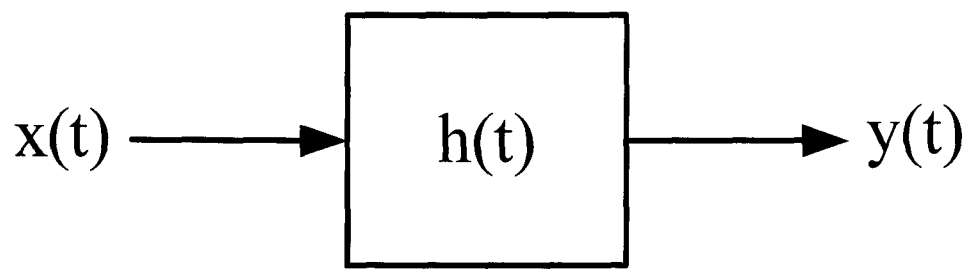
FIG. 6 is a block diagram representation of an input magnetic field gradient waveform x(t), a system impulse response h(t), and a system output magnetic field gradient waveform y(t) for a linear time invariant system.

The fundamental assumption underlying a magnetic gradient waveform correction method according to an embodiment of this invention is that a MRI system (also sometimes referred to herein as "the system") is sufficiently linear and time-invariant ("LTI") that system theory is applicable. This assumption permits the system to be characterized using the block diagram shown in FIG. 6.

A set of system operational constraints are required to ensure that the system is operated within a region such that LTI operation results. System theory indicates that the system output t(t) is the convolution of the system x(t) and the impulse response h(t) and is mathematically represented as $$x(t)*h(t)=y(t). \quad (8)$$

The operator has experimental control over the system input x(t) and the system output y(t) may be measured with the MFGM method. Therefore, an impulse response h(t) may be determined through a deconvolution operation. Knowledge of the impulse response permits the application of system theory in order to determine an input waveform that results in a desired output waveform. The impulse response may be readily determined from the system response to a step function input. The derivation of this result is rarely shown although it is frequently quoted. The derivation of the method used to determine the system impulse response from a step function input is provided below for completeness.

Dirac's delta function or impulse function, $\delta(t)$, is defined in [25] as an intense pulse with unit area and is expressed mathematically as $$\delta(t)=0, \; t\neq 0, \quad (9)$$

$$\int_{-\infty}^{\infty}\delta(t)dt=1. \quad (10)$$

This mathematically convenient notation is often interpreted by $$\lim_{\tau\to 0}\int_{-\infty}^{\infty}\tau^{-1}\Pi\left(\frac{t}{\tau}\right)dt=1 \quad (11)$$

where $$\tau^{-1} \prod \left(\frac{t}{\tau}\right)$$

is a boxcar (or rectangle) function of height $\tau^{-1}$ and width (or base) $\tau$. Note that the limit of equation (11) is unity based on the definition of the impulse function in equation (10). A beneficial property of Dirac's delta function is that $\int_{-\infty}^{x} \delta(t)dt$ equals unity for $x>0$ and it equals zero for $x<0$ resulting in a definition of the unit step function, $u(t)$, $$\int_{-\infty}^{x} \delta(t)dt = u(t). \quad (12)$$

Correspondingly, differentiation both sides of equation (12) yields $$\frac{d}{dt}u(t) = \delta(t). \quad (13)$$

As previously stated, the system output $y(t)$ is the convolution of the input waveform $x(t)$ and the system impulse response $h(t)$ (refer to equation (8)). Substituting a step function $u(t)$ for the input function results in $$u(t)*k(t)=y(t). \quad (14)$$

Differentiating equation (14) results in $$\frac{d}{dt}y(t) = \frac{d}{dt}[u(t)*h(t)] = \delta(t)*h(t) \quad (15)$$

Which results following the application of the derivative theorem in conjunction with the convolution theorem [25]. A function convolved with a delta function results in the original function along with any time-shift (if present) [26]. Therefore, equation (15) is equivalent to $$\frac{d}{dt}y(t) = \delta(t)*h(t) = h(t). \quad (16)$$

The differentiation of a system response resulting from a step input yields the system impulse response. It is this equality that will be applied to extract the system impulse response in this work.

Since the application of an infinite step function is not feasible, the function that is used as the input is a boxcar function with sufficient duration such that the system achieves steady state during the measurement. The measured data can then be truncated in order to approximate step response data. Differentiation of the measured step response data yields the desired system impulse response.

Pre-Equalization

Knowledge of the system impulse response permits the calculation of the required input waveform that provides a desired output waveform. In this case, the input function, $x(t)$ in equation (8) is the unknown variable, the impulse response $h(t)$ is known, and the system output $y(t)$ is set to the desired gradient waveform (for imaging applications). Equation (8) can be rearranged to solve for the pre-equalized input waveform $x_p(t)$ for a desired gradient output waveform $y_d(t)$. This pre-equalization technique is commonly employed in signal processing applications [27, 28] as well as in multiple input multiple output (MIMO) applications [29, 30]. The Fourier and inverse Fourier transforms are applied to transform the convolution operation in the time domain to a division operation in the frequency domain [26]. Hence $$r_p(t) = \mathcal{F}^{-1}\left\{\frac{\mathcal{F}[y_d(t)]}{\mathcal{F}[h(t)]}\right\} \quad (17)$$

where $\mathcal{F}$ and $\mathcal{F}^{-1}$ denote the Fourier and inverse Fourier transform, respectively.

Fundamental System Limitations

Several fundamental limits of the physical system are of critical importance and must be addressed in order to realize the benefits of pre-equalization. One such limit is the slew rate of the amplifier that is used to deliver the required current to the gradient coils to induce the desired magnetic field gradients. Another limit is the available system bandwidth which acts as a low pass filter which limits the maximum rate of change that can occur and can lead to the presence of Gibb's phenomenon [26] if not addressed. Along with the amplifier slew rate and bandwidth constraints, the presence of the impulse response in the denominator of equation (17) results in a system that is sensitive to noise. Correspondingly, the extracted impulse response from the measured data must be processed such that the noise component is reduced while maintaining the integrity of the overall system dynamics. The methods developed to account for these fundamental physical system limits are discussed in the following sections of this disclosure.

Slew Rate Compensation

The amplifier is capable of supplying finite current per unit time to the gradient coils. Correspondingly, the resulting pre-equalized gradient waveform must be constrained such that the resulting waveform is electrically realizable. The amplifier current slew rate is a function of the gradient amplifier and its load, which includes both the gradient coils and the probe assembly. The maximum slew rate can be determined through observation of the derivative of the current being delivered to the gradient coils (for a step response) on an oscilloscope connected to the current monitor installed on many gradient amplifiers. Alternatively, current clamps installed on the gradient feed cables may be used in the absence of a current monitor.

Bandwidth Limitations

In this work, the gradient coils are driven by AE Techron (Elkhart, Ind.) 7782 amplifiers configured in the controlled-current mode of operation. The amplifier compensation circuit has been optimized to ensure maximum power transfer to the load [31]. The amplifier frequency bandwidth is approximately 25 kHz. Correspondingly, any shaped gradient waveforms must limit any discontinuities and/or transitions such that sufficient bandwidth is available to reproduce the desired waveform.

Noise Suppression

The extracted impulse response is based on a MFGM measurement which is subject to noise present in the system. The presence of noise in the measured data can be addressed by increasing the signal-to-noise (SNR) ratio through signal averaging during the measurement. Furthermore, curve fitting techniques can be used to reduce the effects of additional noise during processing if required.

Pre-Equalized Waveform Calculation

Once the system impulse response has been determined, the algorithm used to determine a physically realizable pre-equalized gradient waveform starts with the specification of a desired gradient waveform (as experienced by the sample). The algorithm is implemented using Matlab R2011 (Mathworks, Natick, Mass.) and is outlined above. In this case, we assume that the desired gradient pulse is a hard gradient pulse. Applying equation (17) results in a pre-equalized waveform which may or may not be physically realizable; this waveform defines the required input waveform to the system such that the sample experiences the desired waveform at the output. This waveform is converted from a magnetic field gradient waveform to a waveform that specifies the current that is required (from the gradient amplifier) to drive the gradient coils (such that the desired waveform results). This conversion is completed using known system parameters.

The derivative of the gradient amplifier output current is computed and any values that exceed the maximum slew rate of the gradient amplifier indicate that the waveform is not realizable. For each of these locations, a ramp in the desired gradient is introduced. The pre-equalized waveform is recalculated based on this updated waveform, converted to a gradient amplifier output current, and evaluated to determine if it is within the system operating range and thus physically realizable. This process is repeated (within Matlab) until a realizable gradient amplifier output current waveform results. Note that shaping of the gradient waveform ramp is possible during this iterative process. In our application, a sinusoidal ramp shape (as opposed to a linear ramp) was selected in order to bandlimit the gradient waveform such that the required waveform bandwidth is within the bandwidth of the amplifier. Discontinuities introduced at transitions from a linear ramp can result in a waveform that exceeds the available system bandwidth.

The inclusion of shaped gradient waveform ramps ensures that the system is driven such that the LTI system assumption is accurate. Overdriving the system would result in suboptimal system performance.

Results and Discussion

Figure 7:
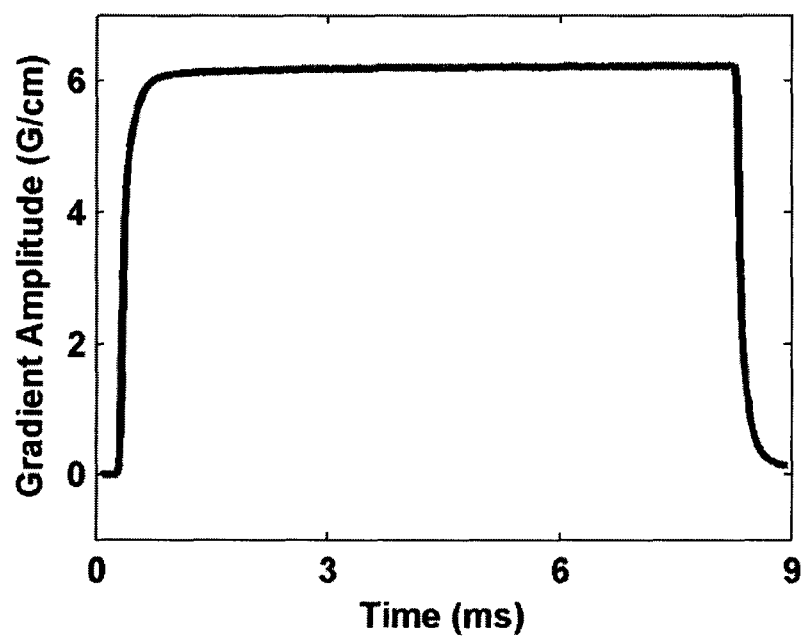
FIG. 7 is a representation of a measured temporal evolution of the magnetic field gradient waveform using MFGM resulting from an 8 ms hard gradient input waveform for a y-directed steady-state magnetic field gradient of $$6.2 \frac{G}{cm}.$$

A hard gradient switch is used such that the measured response approximates that of a step response and provides a worst case scenario for gradient performance. The measured data for a $$6.2 \frac{G}{cm}$$

y-directed gradient is shown in FIG. 7. The MFGM method is a pure phase-encode measurement technique; the accumulated signal phase is directly proportional to the magnetic field gradient experienced by the sample during the encoding time or encoding time period [34, 35].

Figure 8:
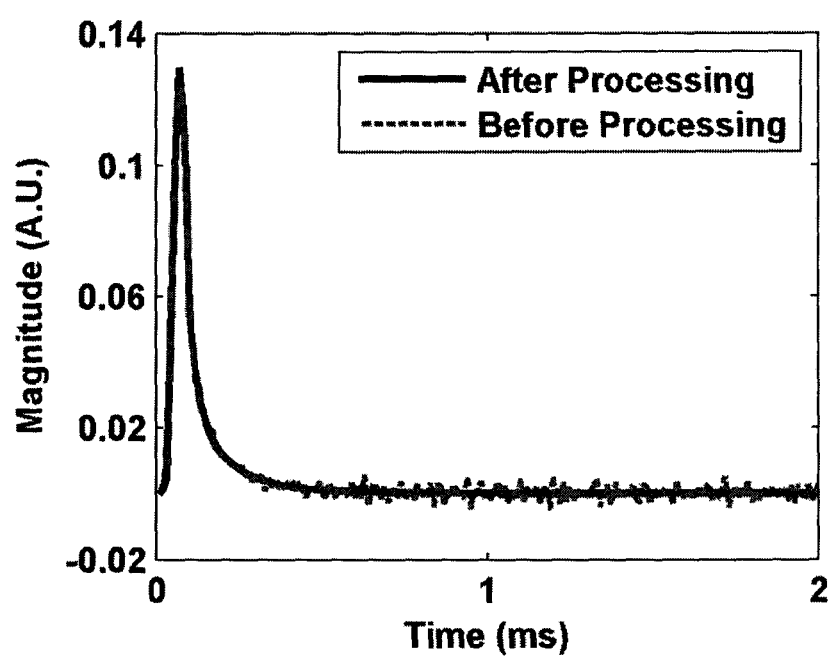
FIG. 8 is a representation of an extracted impulse response h(t) from the derivative of the measured temporal evolution of the magnetic field gradient waveform using MFGM before (dashed line) and after (solid line) data processing to reduce the noise present in the measurement.
Figure 9:
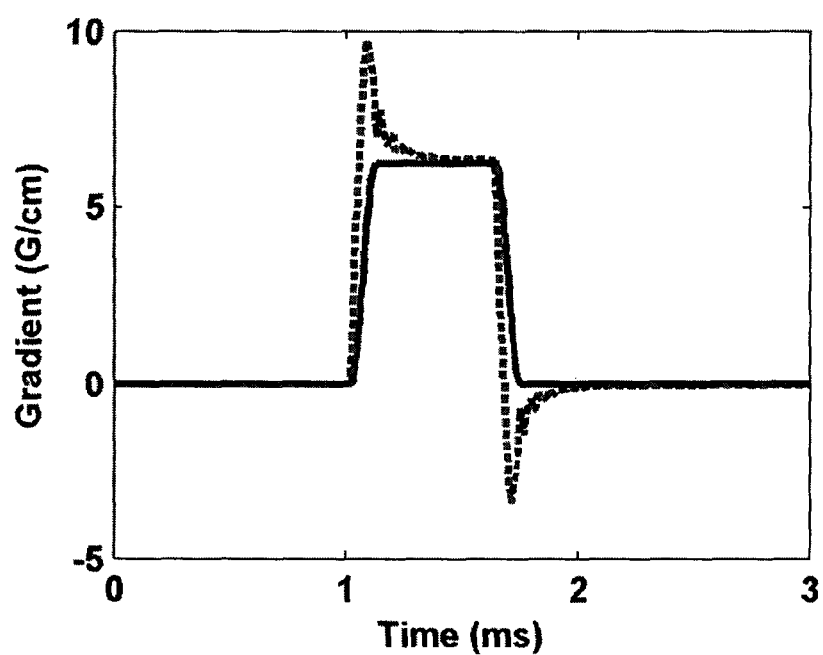
FIG. 9 is a representation of an amplifier slew rate compensated and bandlimited pre-equalized waveform (dashed line) based on the extracted system impulse response h(t) along with the expected output gradient waveform (solid line).

Applying curve fitting techniques to the measured data and differentiating the data yields the extracted impulse response is shown as the solid line in FIG. 8. Differentiation of the measured data prior to processing is shown as the dashed line in FIG. 8. This extracted impulse response is then used to determine the pre-equalized waveform subject to the constraints outlined previously. The resulting amplifier slew rate compensated and bandlimited pre-equalized waveform (dashed line) following the iterative procedure outlined in above and the expected output waveform (solid line) are shown in FIG. 9.

Current exceeding the required steady state current is required during the pre-equalization process in order to reduce the time required for the system to achieve steady-state. Correspondingly, the pre-equalized gradient waveform indicates a maximum input waveform that results in a gradient of $$9.7 \frac{G}{cm}$$

is required which is 1.6 times greater in amplitude than the steady-state value. Hence, the application of a pre-equalized waveform to a system requires that the gradient amplifiers have sufficient overhead such that the required current is delivered to the gradient coil load.

Figure 10:
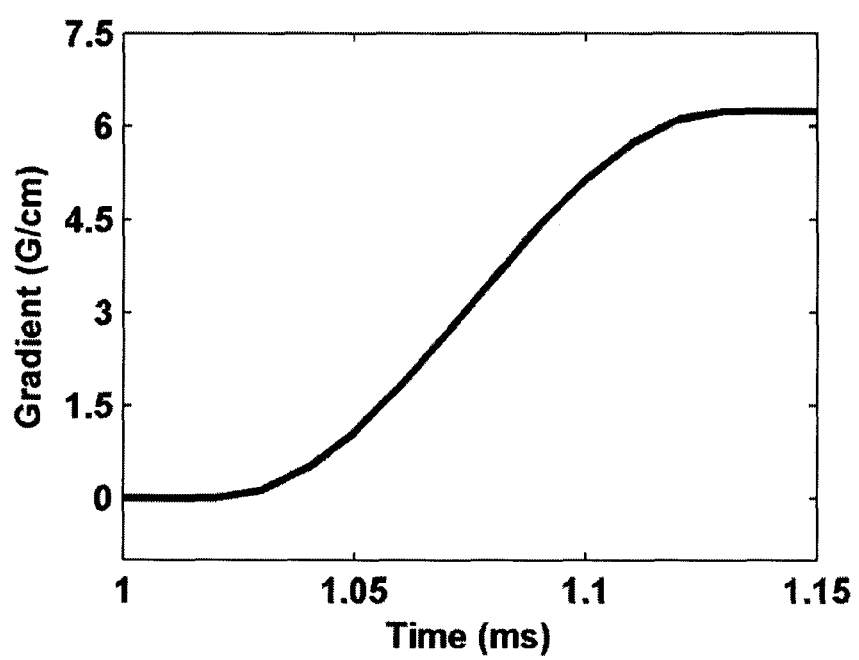
FIG. 10 is a representation of a rising edge of the expected gradient waveform resulting from the application of the pre-equalized waveform to the system.
Figure 11:
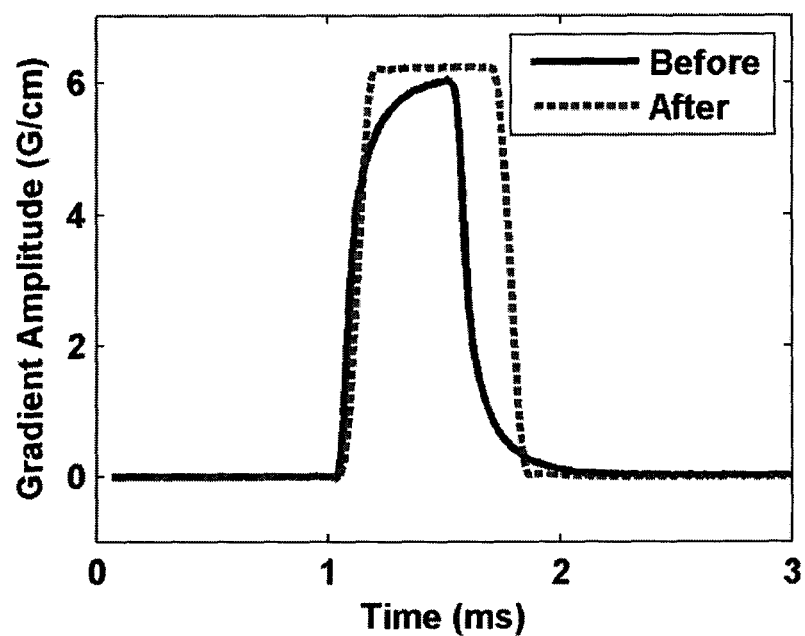
FIG. 11 is a representation of a temporal evolution of the magnetic field gradient before (solid line) and after (dashed line) pre-equalization techniques.

A detailed view of the rising edge is shown in FIG. 10 in order to highlight the slew rate compensation and bandlimiting accomplished through shaping of the waveform. Application of the pre-equalized waveform to the input of the system yields the desired output gradient waveform as shown in FIG. 11. The temporal evolution of the magnetic field gradient waveform both before and after pre-equalization are included to aid in comparison of the results. Note that the gradient applied before pre-equalization does not achieve the desired amplitude level prior to the end of the gradient pulse. A comparison of various timing parameters are shown in Table 1.

TABLE 1

| Measurement Parameter | Single Exponential Time Constant (µs) | 10-90% Risetime (µs) | 1-99% Risetime (µs) |
|---|---|---|---|
| Before Pre-Equalization | 100 | 240 | 1800 |
| After Pre-Equalization | N/A | 90 | 130 |

Note that a single exponential fit to the gradient waveform is not included in Table 1 since the system is not exponential. A significant improvement in the both the 10-90% and 1-99% rise times result after the application of the pre-equalization techniques. Fall time improvements are similar but are not included.

Figure 12:
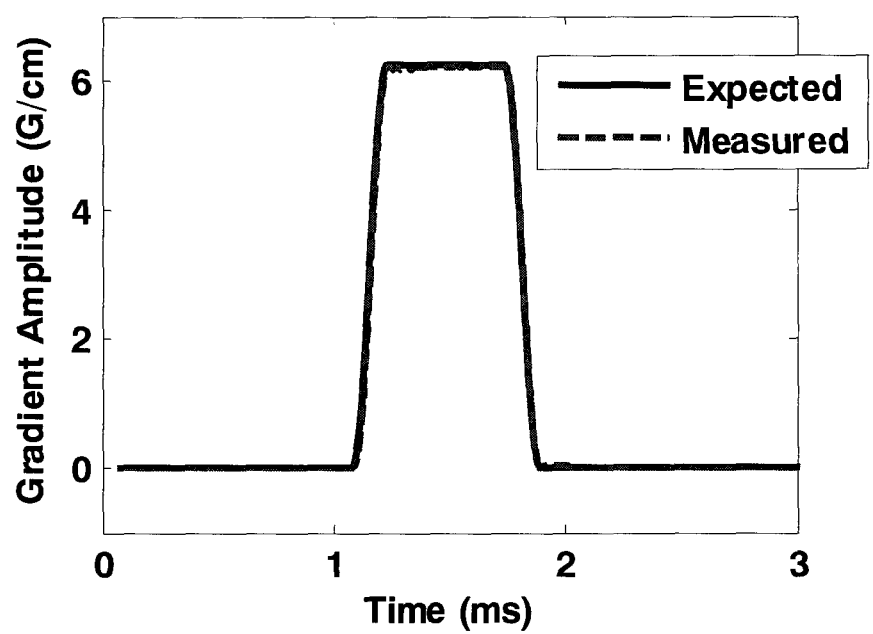
FIG. 12 is a representation of an expected gradient waveform output along with the measured gradient waveform after pre-equalization.
Figure 13:
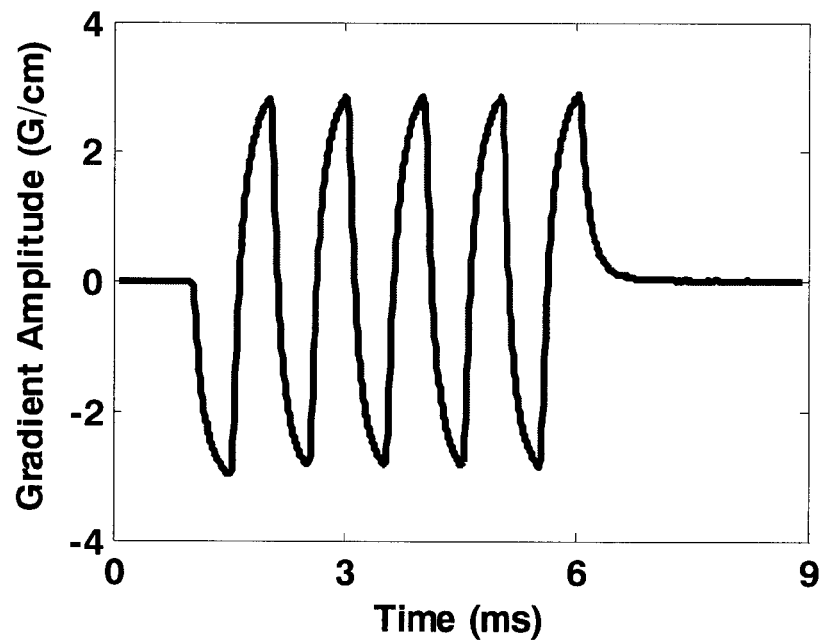
FIG. 13 is a representation of a measured gradient waveform before pre-equalization for an EPI-like gradient waveform.
Figure 14:
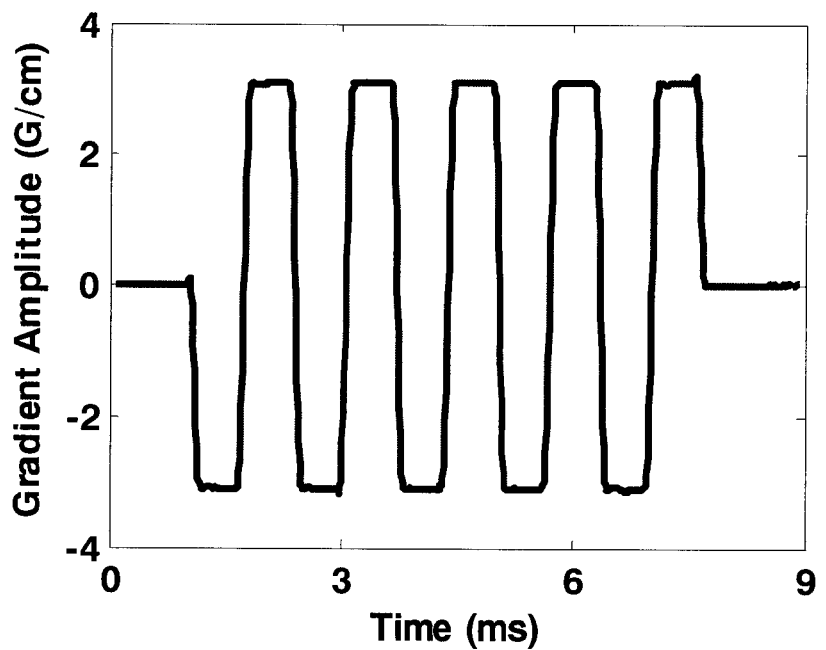
FIG. 14 is a representation of a measured gradient waveform after pre-equalization for an EPI-like gradient waveform.

The expected gradient waveform output determined using Matlab along with the measured gradient waveform are shown in FIG. 12. The excellent agreement obtained between the predicted optimal gradient waveform along with the measured gradient waveform support the assumption that the system is sufficiently linear and time invariant to support the use of the system theory included above along with the system constraints discussed in above. The extraction of the system impulse response permits the calculation of pre-equalized waveform for arbitrary gradient waveforms. The algorithm developed determines the optimal input and output waveform for any arbitrary desired gradient waveform that may not be realizable due to instrument limitations (e.g. amplifier bandwidth, amplifier slew rate, and induced eddy currents). An echo planar imaging (EPI) [32, 33]-like gradient waveform before pre-equalization is shown in FIG. 13. The resulting gradient waveform after pre-equalization is shown in FIG. 14. The duration of the pre-equalized waveform is longer than the non-pre-equalized case because the pre-equalization algorithm introduces sinusoidal ramps at each step such that the resulting waveform is within the hardware capabilities of the system. However, the algorithm also permits the operator to specify the insertion of ramps such the total duration of the waveform remains constant if required to maintain the temporal fidelity of the pulse sequence.

The extracted impulse response shown in FIG. 8 was used to determine the pre-equalized waveform for an EPI-like sequence. Significant improvements in the waveform shape are clearly observed. The extracted impulse response can be used to determine the required pre-equalized waveform for any gradient waveform of arbitrary shape and duration.

Figure 15:
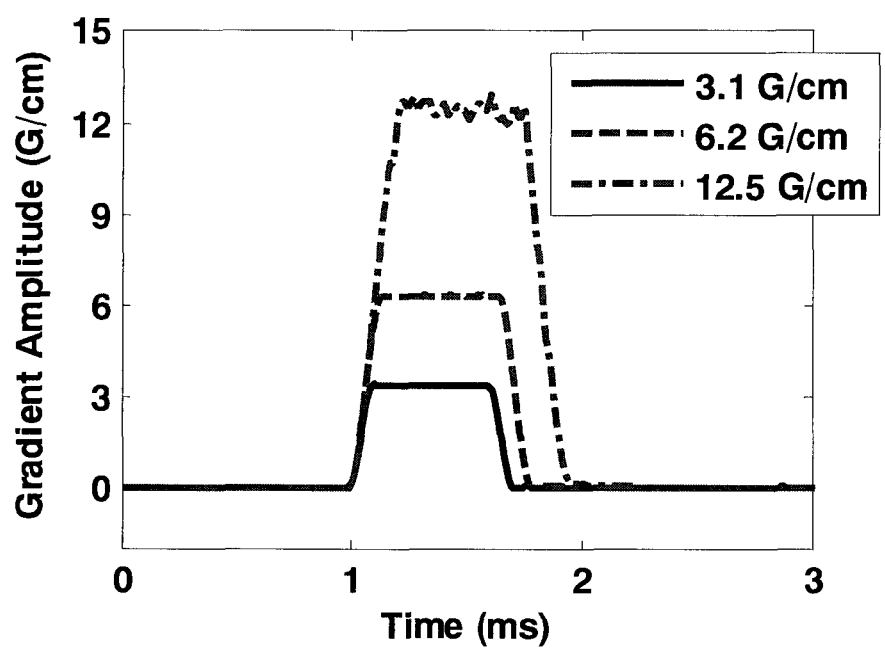
FIG. 15 is a representation of gradient waveforms following the application of the three different pre-equalized waveforms, for gradient amplitudes of 3.1 (solid), 6.2 (dashed), and 12.5 (dash-dot) G/cm.

The finite slew rate of the gradient amplifier results in gradient waveforms that differ in rise and fall times after pre-equalization techniques have been applied. As expected, the time required to achieve a desired gradient level increases as the gradient amplitude increases. Furthermore, the correct characterization of the LTI system along with proper slew rate and bandwidth constraints should lead to linear increases in rise and fall times. The resulting gradient waveforms following the application of three different pre-equalized waveforms for gradient amplitudes of 3.1, 6.2, and 12.5 G/cm are shown in FIG. 15.

Note that rising edges of each waveform are very similar. This indicates that the system is operating linearly and the bandwidth and slew rate constraints have been set correctly. The difference in overall pulse length is due to the insertion of the sinusoidal ramps in the rising and falling edge, as discussed previously. The additional noise present in the 12.5 G/cm gradient waveform is due to the application of the multiple FID point method [34] used with the MFGM method. The multiple FID point method was used for the 12.5 G/cm measurement in order to improve the phase discrimination of the method [34]. The fidelity of the measured can be improved through probe repositioning and adjustment of the sample volume. Repositioning of the MFGM probe closer to the gradient isocenter will reduce the phase accumulation during the measurement and can yield high fidelity measurements when used with the multiple FID point method.

The results summarized above support the assumption that the magnetic field gradient system is sufficiently linear and time invariant to permit the application of system theory techniques to the overall system operation. The extraction of the system impulse response through the truncation of the MFGM-measured temporal evolution of the magnetic field gradient resulting from a long duration boxcar or rectangular input was successfully completed. The algorithm developed to determine the optimal bandlimited and slew rate compensated input and output waveforms was shown to accurately predict both the optimal input and output waveforms for various gradient waveforms including a single pulse, an EPI-like waveform, as well as gradient waveforms with varying amplitudes. In fact, knowledge of the system impulse response function coupled with the ability to bandlimit and slew rate compensate both the desired and corresponding pre-equalized waveforms results in a technique that is general in nature and is not limited to permanent-magnet based systems. Superconducting magnet based system are naturally compatible with this technique. The fidelity of the magnetic field gradient as experience by the sample can be greatly improved through the application of the pre-equalization techniques discussed.

Experiment

The system used during the testing and evaluation of this technique was an Oxford Instruments (Abingdon, Oxfordshire, UK) 8.5 MHz MARAN DRX HF permanent magnet based system with AE Techron (Elkhart, Ind.) 7782 industrial amplifiers. The RF probe is a custom-built reduced diameter probe suitable for rock core imaging applications. MFGM was used to measure the temporal evolution of the magnetic field gradient waveform in response to a hard gradient pulse of 8 ms duration with a measurement resolution of 10 μs.

The MFGM probe consists of a custom built 14-turn solenoidal coil connected to a piece of semi-rigid coaxial cable with a Teflon dielectric. A spherical bulb micro cell of 6 mm inner diameter and 8 mm outside diameter (Wilmad Lab-Glass, Vineland, N.J.). 110 nL of a heavily $GdCl_3$ doped water solution was syringed into the spherical bulb and then flame sealed. This spherical bulb was inserted into the coil. The sample and probe RF shield consists of isolated copper sheets that were overlapped such that gradient switch induced eddy currents were minimized while maintaining adequate RF shield performance. The probe was tuned to 8.5 MHz and matched to 50Ω using a capacitive tuning circuit. The Q of the probe is 35.

REFERENCES

[1] M. A. Bernstein, K. F. King, X. J. Zhou, Handbook of MRI pulse sequences, Elsevier Academic press, New York, 2004.
[2] F. Schmitt, M. K. Stehling, R. Turner, Echo-planar imaging, Springer-Verlag, Berlin, 1998.
[3] W. Block, J. Pauly, A. Kerr, D. Nishimura, Consistent fat suppression with compensated spectral-spatial pulses, Magn. Reson. Med. 38 (1997) 198-206.
[4] J. C. Haselgrove, J. R. Moore, Correction for distortion of echo-planar images used to calculate the apparent diffusion coefficient, Magn. Reson. Med. 39 (1997) 960-964.
[5] A. Lingamneni, P. A. Hardy, K. A. Powell, N. J. Pelc, R. D. White, Validation of cine phase-contrast MR imaging for motion analysis, J. Magn. Reson. Imaging, 5 (1995) 331-338.
[6] G. Mason, T. Harshbarger, H. Hetherington, Y. Zhang, G. Pohost, D. Twieg, A method to measure arbitrary k-space trajectories for rapid MR imaging. Magn. Reson. Med. 38 (1997) 492-496.
[7] Y. T. Zhang, H. P. Hetherington, E. M. Stokely, G. M. Mason, D. B. Twieg, A novel k-space trajectory measurement technique, Magn. Reson. Med. 39 (1998) 999-1004.
[8] J. H. Duyn, Y. H Yang, J. A. Frank, Simple correction method of k-space trajectory deviations in MRI, J. Magn. Reson. 132 (1998) 150-153.
[9] D. H Kim, D. M Spielman, Reducing gradient imperfections for spiral magnetic resonance spectroscopic imaging, Magn. Reson. Med. 56 (2006) 198-203.
[10] P. Latta, M. L. Gruwel, V. Volotovskyy, M. H. Weber, B. Tomanek, Simple phase method for measurement of magnetic field gradient waveforms, Magn. Reson. Imaging. 25 (2007) 1272-1276.
[11] V. Jellus, J. C. Sharp, B. Tomanek, P. Latta, An NMR technique for measurement of magnetic field gradient waveforms, J. Magn. Reson. 162 (2003) 189-197.
[12] A. Takahashi, T. Peters, Compensation of multi-dimensional selective excitation pulses using measured k-space trajectories. Magn. Reson. Med. 34 (1995) 446-456.
[13] M. T. Alley, G. H. Glover, N. J. Pelc, Gradient characterization using a Fourier-transform technique. Magn. Reson. Med. 39 (1998) 581-587.
[14] N. Papadakis, A. A. Wilkinson, T. A. Carpenter, L. D. Hall, A general method for measurement of the time integral of variant magnetic field gradients: application to 2D spiral imaging. Magn. Reson. Imaging. 15 (1997) 567-578.

[15] 15. N. De Zanche, C. Barmet, J. A. Nordmeyer-Massner, K. P. Pruessmann, NMR probes for measuring magnetic fields and field dynamics in MR systems, Magn. Reson. Med. 60 (2008) 176-186.

[16] C. Barmet, N. De Zanche, K. P. Pruessmann, Spatiotemporal magnetic field monitoring for MR, Magn. Reson. Med. 60 (2008) 187-197.

[17] D. J. Goodyear, M. Shea, S. D. Beyea, N. J. Shah, B. J. Balcom, Single point measurements of magnetic field gradient waveform, J. Magn. Reson. 163 (2003) 1-7.

[18] D. I. Hoult, R. E. Richards, The signal-to-noise ratio of the nuclear magnetic resonance experiment, J. Magn. Reson. 24 (1976) 71-85.

[19] D. I. Hoult, The principle of reciprocity in signal strength calculations—a mathematical guide, Concepts. Magn. Reson. 12 (2000) 173-187.

[20] J. Mispelter, M. Lupu, A. Briquet, NMR probeheads for biophysical and biomedical experiments theoretical principles & practical guidelines, Imperial College press, London, 2006.

[21] T. L. Peck, R. L. Magin, P. C. Lauterbur, Design and analysis of microcoils for NMR microscopy, J. Magn. Reson. 34 (1979) 425-433.

[22] M. Halse, D. J. Goodyear, B. MacMillan, P. Szomolanyi, D. Matheson, B. J. Balcom, Centric scan SPRITE magnetic resonance imaging, J. Magn. Reson. 165 (2003) 219-229.

[23] P. Jezzard, A. S. Barnett, C. Pierpaoli, Characterization of and correction for eddy current artifacts in echo planar diffusion imaging, Magn. Reson. Med. 39 (1998) 801-812.

[24] T. G. Reese, O. Heid, R. M. Weisskoff, V. J. Wedeen, Reduction of eddy-current-induced distortion in diffusion MRI using a twice-refocused spin echo, Magn. Reson. Med. 49 (2003) 177-182.

[25] R. N. Bracewell, The Fourier transform and its applications, McGraw-Hill, New York, 1965.

[26] S. Haykin, Communication systems, Wiley, New York, 1994.

[27] H. Liu, G. Xu, Multiuser blind channel estimation and spatial channel pre-equalization, 1995 International Conference on Acoustics, Speech, and Signal Processing. 3 (1995) 1756-1759.

[28] T. Keller, L. Hanzo, Adaptive modulation techniques for duplex OFDM transmission, IEEE Trans. Veh. Technol. 49 (2000) 1893-1906.

[29] R. F. H. Fischer, C. Windpassinger, A. Lampe, J. B. Huber, MIMO precoding for decentralized receivers, in: Proceedings IEEE International Symposium on Information Theory, IEEE, 2002: p. 496.

[30] M. Joham, W. Utschick, J. a. Nossek, Linear transmit processing in MIMO communications systems, IEEE Trans. Signal. Proces. 53 (2005) 2700-2712.

[31] R. J. Smith, R. C. Dorf, Circuits, Devices and Systems, 5th ed., John Wiley and Sons, Toronto, 1992.

[32] P. Mansfield, Multi-planar image formation using NMR spin echoes, J. Phys. C: Solid State Phys. 10 (1977) 55-58.

[33] M. A. Bernstein, K. E. King, X. J. Zhou, W. Fong, Handbook of MRI Pulse Sequences, Elsevier, 2004.

[34] H. Han, A. V Ouriadov, E. Fordham, B. J. Balcom, Direct measurement of magnetic field gradient waveforms, Concepts Magn. Reson., Part A. 36 (2010) 349-360.

[35] H. Han, R. P. MacGregor, B. J. Balcom, Pure phase encode magnetic field gradient monitor, J. Magn. Reson. 201 (2009) 212-7.

What is claimed is:

1. A method for correcting a magnetic field gradient waveform in a magnetic resonance measurement comprising:
    making a magnetic resonance measurement with a magnetic resonance system,
    obtaining a step response measurement of the system,
    extracting an impulse response from the measured step response,
    determining the slew rate of the system during the step response measurement,
    modifying a desired output waveform such that the desired output waveform is constrained to within the slew rate and the bandwidth of the system, and
    determining a required pre-equalized input waveform.

2. The method of claim 1 wherein the required pre-equalized waveform is determined through a deconvolution of the desired output waveform with the extracted impulse response in the time domain.

3. The method of claim 1 wherein the required pre-equalized waveform is determined through division of the frequency domain representations of the desired output waveform and the extracted impulse response and further transforming the resulting data to the time domain.

4. The method of claim 1 further comprising applying the pre-equalized waveform to the input of the gradient system whereby an output waveform that corresponds to the desired constrained waveform is obtained.

5. The method of claim 1 wherein the magnetic resonance measurement is made using the magnetic field gradient method.

6. The method of claim 1 wherein the magnetic resonance measurement is made using a magnetic field monitoring method.

* * * * *